United States Patent
Hauer

(10) Patent No.: US 7,892,625 B2
(45) Date of Patent: Feb. 22, 2011

(54) METHOD OF FABRICATING AN ELECTRICAL CONNECTING ELEMENT, AND AN ELECTRICAL CONNECTING ELEMENT

(75) Inventor: Marc Hauer, Zurich (CH)

(73) Assignee: Dyconex AG, Basserdorf (CH)

(*) Notice: Subject to any disclaimer, the term of this patent is extended or adjusted under 35 U.S.C. 154(b) by 1215 days.

(21) Appl. No.: 11/458,861

(22) Filed: Jul. 20, 2006

(65) Prior Publication Data

US 2008/0026187 A1    Jan. 31, 2008

(51) Int. Cl.
*H01R 43/00* (2006.01)
*B21K 1/20* (2006.01)

(52) U.S. Cl. .................... 428/188; 428/327
(58) Field of Classification Search .......... None
See application file for complete search history.

(56) References Cited

U.S. PATENT DOCUMENTS

| | | |
|---|---|---|
| 5,047,279 A | 9/1991 | Nasu et al. |
| 6,007,886 A | 12/1999 | Takigami |
| 6,113,999 A | 9/2000 | Takigami |
| 6,903,431 B2* | 6/2005 | He .......................... 257/426 |
| 6,979,890 B2* | 12/2005 | Kambe et al. ............. 257/678 |
| 2005/0170631 A1* | 8/2005 | Yuri ........................ 438/618 |

FOREIGN PATENT DOCUMENTS

| | | |
|---|---|---|
| EP | 0 195 935 | 10/1986 |
| JP | 2003-309359 | 10/2003 |
| JP | 2004-241526 | 8/2004 |
| JP | 2004-247342 | 9/2004 |
| JP | 2005-311073 | 11/2005 |
| WO | 2004/030429 | 4/2004 |

* cited by examiner

*Primary Examiner*—D. Lawrence Tarazano
*Assistant Examiner*—Camie S Thompson
(74) *Attorney, Agent, or Firm*—Rankin, Hill & Clark LLP

(57) ABSTRACT

A method of manufacturing an electrical connecting element with a predetermined breaking point is provided, the method comprising the steps of providing a core which comprises fiber reinforced material, of cutting the core at a cutting location where the predetermined breaking point is to be, and thereby creating a cut in the core, of adding at least one layer of material including a dielectric in a non-hardened state, the at least one layer at least partially covering the cut, and thereby at least partially filling the cut with dielectric material, of hardening the dielectric material, and of cutting through the layer of material at the cutting location.

8 Claims, 5 Drawing Sheets

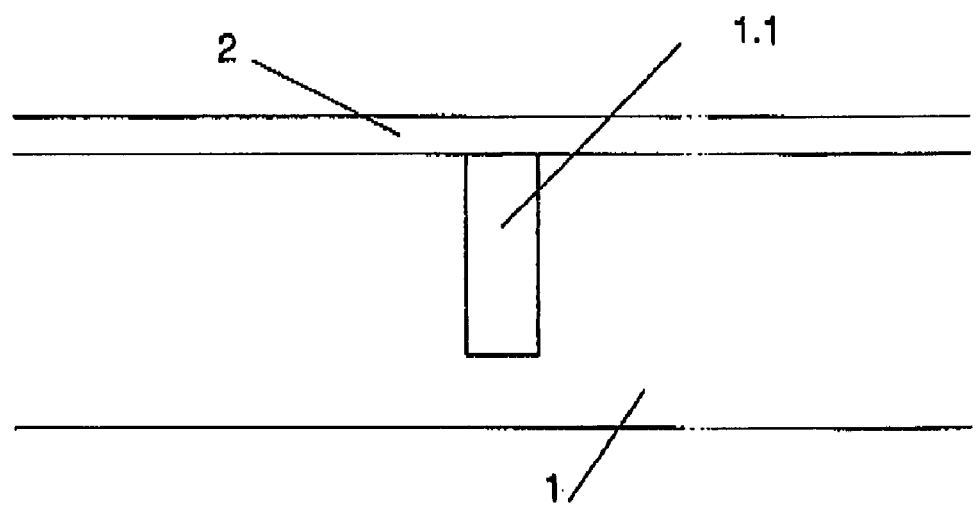
Prior Art     Fig. 1a
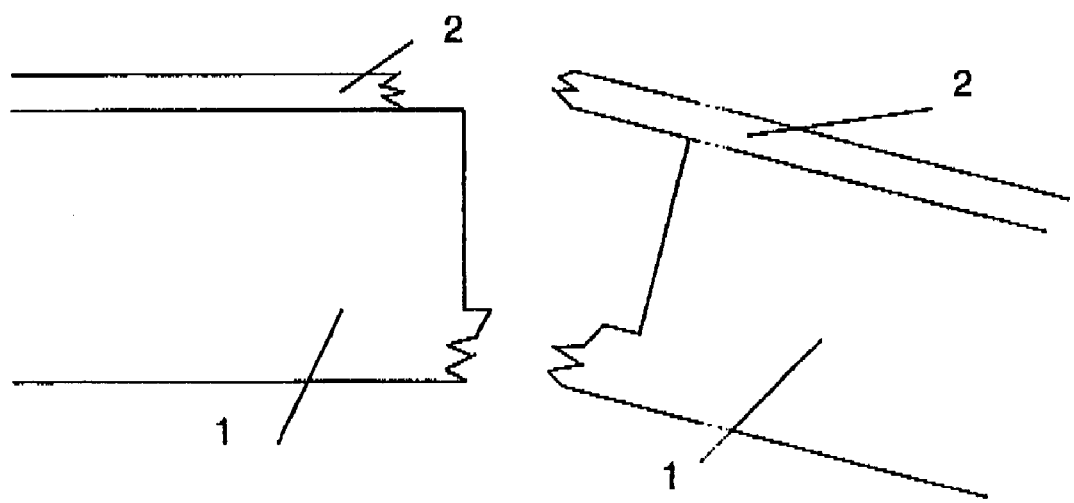
Prior Art     Fig. 1b

METHOD OF FABRICATING AN ELECTRICAL CONNECTING ELEMENT, AND AN ELECTRICAL CONNECTING ELEMENT

BACKGROUND OF THE INVENTION

1. Field of the Invention

The invention concerns the field of electrical connecting elements. Such electrical connecting elements are wiring systems for a set-up of active and/or passive electrical and/or electronic components. Examples for electrical connecting elements are printed circuit boards, High Density Interconnects, Flex-Prints, Interposers etc. In particular, the invention concerns the manufacturing of an electrical connecting element with a rigid (dimensionally stable) section, and an electrical connecting element with a rigid section.

2. Description of the Related Art

Printed circuit boards with predetermined breaking points are known. Use of such printed circuit boards may be advantageous in a fabrication process. For example, they make the assembly of a plurality of devices on a common printed circuit board product possible, which product, only after assembly, is broken into a plurality of printed circuit boards with components thereon. Also, they may allow more economical handling and storing on the manufacturer's side. In accordance with the state of the art, for providing a printed circuit board with a predetermined breaking point, a preliminary product is cut in (grooved) at the desired location. Thereafter, an additional layer is added to the preliminary product, the additional layer covering the cut. When the thus manufactured printed circuit board is cracked along the incision, the additional layer is disrupted. However, the place where the additional layer is disrupted is not very precisely defined. This is illustrated in FIGS. 1a and 1b. FIG. 1a shows the preliminary product 1 with a cut 1.1 and an additional layer 2. When the board is parted, the additional layer's line of disruption especially does not always exactly coincide with the cut. Rather, the additional layer may be partly peeled off, as illustrated in FIG. 1b.

Due to the resulting uncertainty, a neighborhood of the predetermined breaking point may not be used for wiring and/or assembly.

BRIEF SUMMARY OF THE INVENTION

Accordingly, it is an object of the invention to provide a method of manufacturing an electrical connecting element with a predetermined breaking point where the front surface resulting after breaking the board into pieces is well-defined. Also, the predetermined breaking point should be provided such that cracks ranging inward from the breaking point are prevented.

According to a first aspect of the invention, a method of manufacturing a electrical connecting element with a predetermined breaking point is provided, the method including the steps of providing a core which comprises fiber reinforced material, of cutting the core at a cutting location where the predetermined breaking point is to be, and thereby creating a cut in the core, of adding at least one layer of material comprising a dielectric material in a non-hardened state, the layer at least partially covering the cut, thereby at least partially filling the cut with the dielectric material, of hardening the dielectric material, and of cutting the layer at the cutting location.

The term 'predetermined breaking point' denotes any location on the electrical connecting element at which the electrical connecting element is to be parted, if mechanical forces are applied to the board. The term does not define the shape of the location. Rather, the predetermined breaking point may have the shape of a line (straight line, or bended and/or broken line), of a system of lines (including a grid of lines), or a more complex shape.

The term 'cutting' includes any technique by which a cut may be added including laser cutting, laser routing and punching. Whereas the cut preferably reaches, preferably perpendicularly, to the two large faces through the core, this need not be the case. Rather, the cut may also have the shape of an indentation not quite reaching through an entire thickness of the core but essentially reaching through all fiber layers.

A non-hardened state is a state of the dielectric material in which it is in a liquid or viscous or plastically deformable state.

The invention features substantial advantages in that it applies to boards (or substrates) of fiber reinforced dielectric material, that it provides for a well-defined, well-sealed line of rupture, and that the wiring may be provided closer to the line of rupture, so that an increased wiring density and compactness is achievable. In a preferred embodiment, a security zone, as narrow as 0.2 mm, preferably 0.1 mm and even down to 50 µm is possible. The broadness of a 'security zone' is defined as the closest distance from a rim of the cut to a conductor path.

A further advantage is that the fiber reinforced dielectric material is a relatively low-cost, solid material for electrical connecting elements (such as printed circuit boards) or printed circuit board substrates, and that the line of rupture nevertheless can be very clean and free of fiber material.

In a preferred embodiment, the plate-shaped core is provided with a layer of material on both faces. The last step of cutting through the fiber material is then performed on both faces (top and bottom).

Preferably, the dielectric material of the layer of material is of a thermosetting type and in the non-hardened state is not completely cured, but preferably partially cured. The dielectric material may for example be a fiber reinforced material, such as a fiber reinforced resin. The material may for example be in the so-called b-stage which is an intermediate stage in the reaction of a number of thermosetting resins in which the material swells when in contact with certain liquids and softens when heated, but may not entirely dissolve or fuse. The layer of material may, thus for example, be a resin impregnated fiber material. Especially, it may be a Prepreg. Alternatively, it may be an RCC layer (Resin Coated Copper layer) free of fiber material.

The fibers of the fiber reinforced core material or, if present, of the fiber material of the additional layer(s) are preferably continuous fiber, i.e. fibers of an average length of more than a third of the characteristic dimensions of the electrical connecting element or more than the width of the cut (more than 50 µm, more than 100 µm or more than 200 µm) or at least long fibers (fibers of a length exceeding 1 mm). Any suitable fiber material may be used, for example glass, aramid, carbon, boron etc.

Both, the core and the added at least one layer may be provided with one or a plurality of conductor layers of, possibly, structured conductor material, for example copper or a copper alloy. Between different conductor layers, vias contacting conductor paths of different layers with each other may be present.

Further, the core and/or the at least one added layer may be provided with at least one metallic reinforcement layer, which also may serve as a shielding layer and/or a constant potential reference layer.

According to a second aspect, the invention concerns an electrical connecting element, the electrical connecting element comprising a plurality of layers including at least one layer of a fiber reinforced material and a plurality of structured conductor layers forming a pattern of conductor paths, the electrical connecting element further comprising a predetermined breaking point, wherein the fibers of an inner one of said fiber reinforced material layers are interrupted by a region of fiberless dielectric material at the predetermined breaking point, and wherein the electrical connecting element comprises a groove at the predetermined breaking point so that at least one outer one of said plurality of layers is cut at the predetermined breaking point.

Preferably, the electrical connecting element comprises a plurality of layers of a fiber reinforced material. Also, preferably, said outer layer is a layer of a fiber reinforced material.

According to yet another aspect, the invention concerns an electrical connecting element, at least sections of which are plate-shaped and are dimensionally stiff and defining two faces, the electrical connecting element comprising a plurality of fiber reinforced resin layers and a plurality of possibly structured conductor layers arranged between pairs of said fiber reinforced resin layers or on at least one outermost surface of the electrical connecting element or between pairs of said fiber reinforced layers and on at least one outermost surface of said electrical connecting element, the electrical connecting element or a plate-shaped section thereof comprising a line-shaped portion which is free of fiber material throughout the entire thickness of the electrical connecting element or plate-shaped section, respectively, the electrical connecting element or plate-shaped section thereof further comprising a groove in each face at a lateral position of the line-shaped portion.

BRIEF DESCRIPTION OF THE DRAWINGS

In the following, preferred embodiments of the invention are described with reference to drawings. The drawings are all schematical and not to scale. In the drawings, FIGS. 1a and 1b show a printed circuit board with a predetermined breaking point according to the state of the art in an intact and broken state, respectively.

DETAILED DESCRIPTION OF THE PREFERRED EMBODIMENTS OF THE INVENTION

Figure 2:
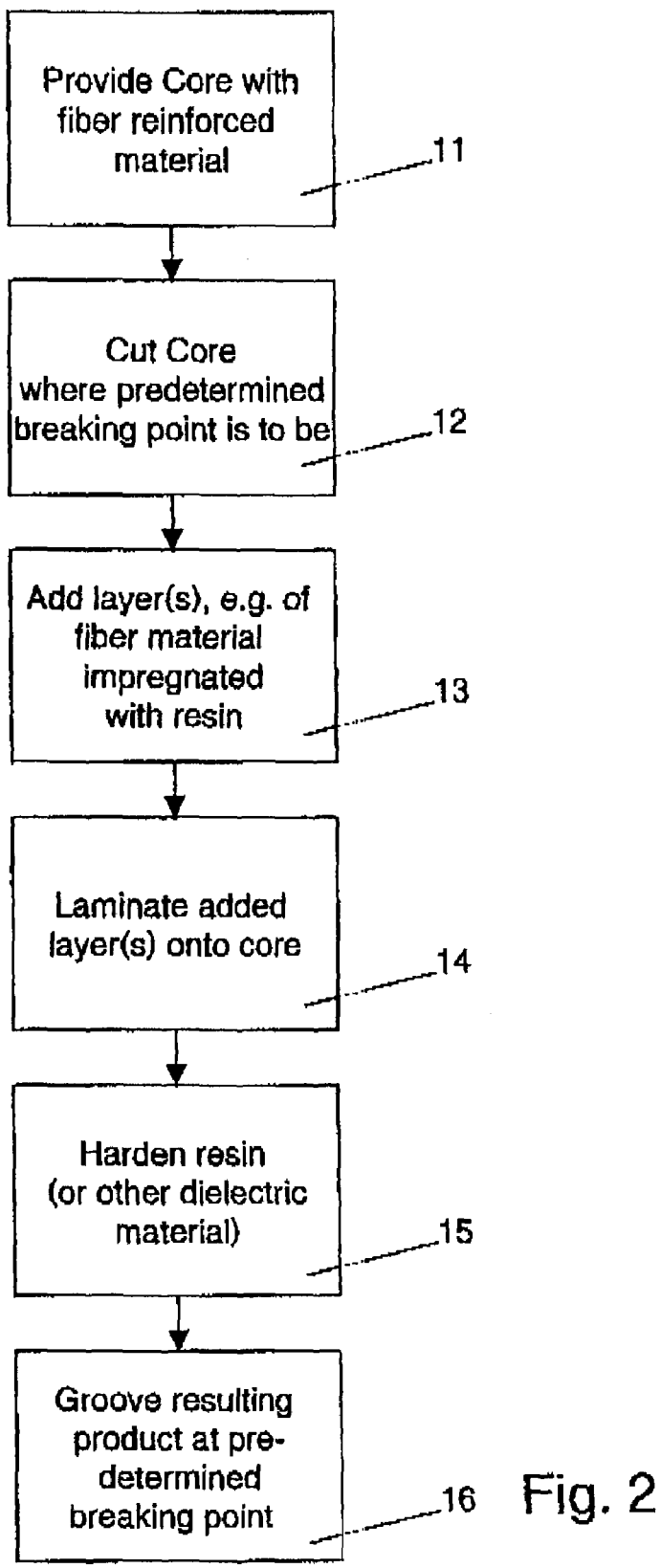
FIG. 2 shows a flowchart of a process in accordance with the invention.

A flowchart of an embodiment of the process according to the invention is shown in FIG. 2. In a first step 11, a core which comprises fiber reinforced dielectric material is provided. The core may consist of a plurality of layers of hardened resin material reinforced with fibers. As an alternative, the core may comprise a plurality of electrically insulating layers, at least one of which comprises a fiber reinforcement, and at least one structured or potentially unstructured conductor layer between the electrically insulating layers. If more than one structured or unstructured conductor layer is present between the electrically insulating layers, the core may comprise at least one via being an electrical connection of conductor portions of different layers.

Thereafter, the core is cut at a location where the predetermined breaking point is to be. The cutting is done by any known cutting process, such as by laser cutting, by laser routing, by punching, by milling, by means of a cutter etc. The according step is denoted by 12 in FIG. 2.

Before being cut, the core may be provided with at least one outermost layer of conductor material which is preferably structured to form a pattern of conductor paths and/or conductor areas. Also, according to a variant, the core may comprise at least one outermost conductor layer already before the cutting step, and said at least one outermost conductor layer may be structured before or after the cutting step.

As a next step 13, at least one layer of material, being preferably at least one layer of fiber material impregnated with unhardened resin, is added. The layer at least partially covers the cut created in the previous step 12. Optionally, the at least one additional layer is laminated (or press-laminated) onto the core (if necessary; step 14). Steps 13 and 14 may be combined into one single action. While the added layer is laminated or press-laminated onto the core, dielectric material (resin material in the example discussed here) flows into the cut.

The dielectric material (for example resin material) may be any suitable synthetic polymeric, polycondensated, polimerizeable and/or polycondensable material which in a first state is liquid or viscous and may brought from the first to a second state in which it is hardened. The fiber material (if any) may be the same material as the fiber reinforcement of the core, or may be different. Generally, the fibers in fiber reinforced layers may comprise (tow or roving like) bundles of aligned fibers, may comprise bundles of twisted fibers, fiber webs etc. or may be in an unaligned or in any other configuration. The layer(s) of material added to the core may, as an alternative to being fiber reinforced layers, also be RCC layers or other layers including a non-hardened dielectric material. Especially, the layer(s) of material may according to a special embodiment consist of the non-hardened dielectric material only.

While or after the additional layer(s) is/are added and/or are being laminated or press-laminated onto the core, the dielectric material is hardened (step 15). Hardening of dielectric material may be done by any method suitable for the dielectric material (for example resin) chosen. As a first example, the dielectric may be composed of at least two components while or shortly before the fiber material is impregnated with it. The two components are capable of reacting with each other, in a manner that a thermosetting dielectric is obtained. As an alternative, the dielectric material may be of a type curable by means of illumination by electromagnetic radiation, by heat enacting on the dielectric material or by other means known in the art. As yet another alternative, the dielectric may be of a thermoplastic type, in which situation the method steps 13 and 14 are performed at an elevated temperature, and the hardening step 15 is a cooling step. The skilled person will know yet further alternatives for hardening a dielectric material, such as a resin.

Thereafter, the resulting product is grooved in a manner that the fibers (if any) of the added layer(s) are cut through at the location where the predetermined breaking point is to be, but that dielectric material which has filled the cut at least partially remains in the cut. In other words, in this grooving step 16, the product is grooved but not cut through. Before or after the grooving, additional steps of adding and/or structuring conductor layers may be performed. Also, before or after grooving, the entire product or selective surfaces thereof may be provided with a shielding or passivation layer for protection.

Figure 3A:
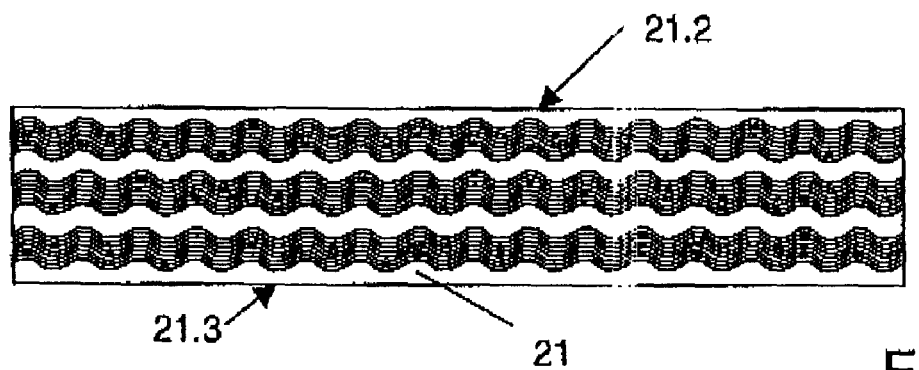
FIGS. 3a through 3e illustrate, in a sequence, the product resulting after process steps according to the invention.
Figure 3B:
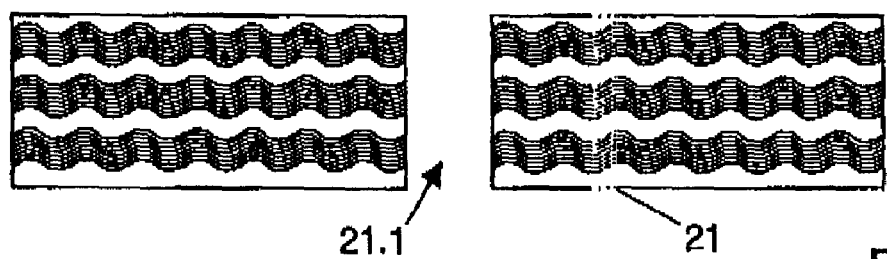
Figure 3C:
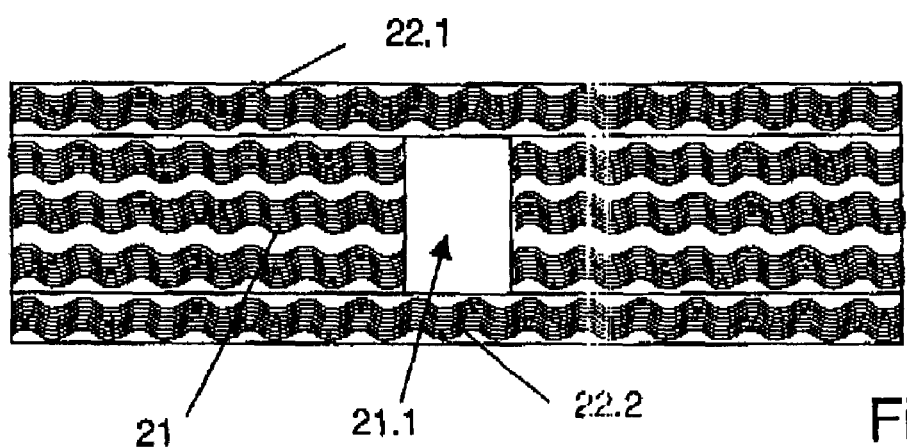
Figure 3D:
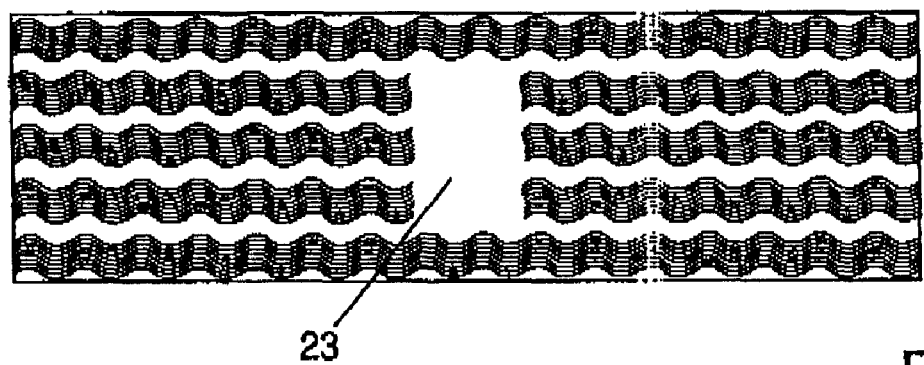
Figure 3E:
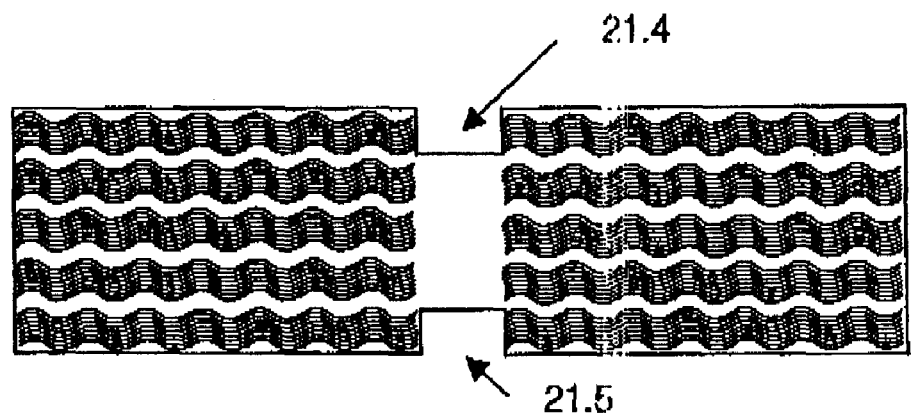

FIG. 3a schematically shows a core 21 having three layers of fiber reinforced dielectric material. The optional structured conductor layers between layers of fiber reinforced dielectric material and/or on the surfaces of the core are not shown in the figure. In FIG. 3b the core is shown after cutting. The cut 21.1 in the shown embodiment reaches through the core. FIG. 3c depicts the product after a layer 22.1, 22.2 of fiber material impregnated by a resin has been added to each one of the two faces 21.2, 21.3 of the core. The cut 21.1 is on both sides covered by the additional layer 22.1, 22.2, respectively. Of course, in practice, the idealized situation depicted in FIG. 3c where the additional layers of resin impregnated fibers just lie on top of the core 21 and the cut is free of any material, will most often not occur (with the possible exception of thermoplastic resin impregnated fibers added at a temperature well below a handling temperature). Rather, the viscous resin material will immediately start filling the cut 21.1. In FIG. 3d, the situation after laminating the core 21 and the additional layers 22.1, 22.2 onto each other is shown. The cut is filled with resin material 23. FIG. 3e, finally, depicts the product after the grooving step. The grooves' 21.4, 21.5 lateral position coincides with the lateral position of the cut. In the embodiment with two additional layers, the product is grooved on both sides.

In order to produce the finished electrical connecting element from the product shown in FIG. 3e, additional steps may be, but need not be, necessary.

Even though the illustration in FIGS. 3d and 3e shows how the resin fills the cut entirely, this need not be the case. Incomplete filling, potentially with air bubbles etc. may occur and does usually not constitute a problem at all. This is because the region which is not bubble free—the predetermined breaking point—does not carry any conductor paths and is, once the board (or other electrical connecting element) has been broken, entirely peripheral. Reproducible dielectric properties in this confined region are not critical.

Figure 4:
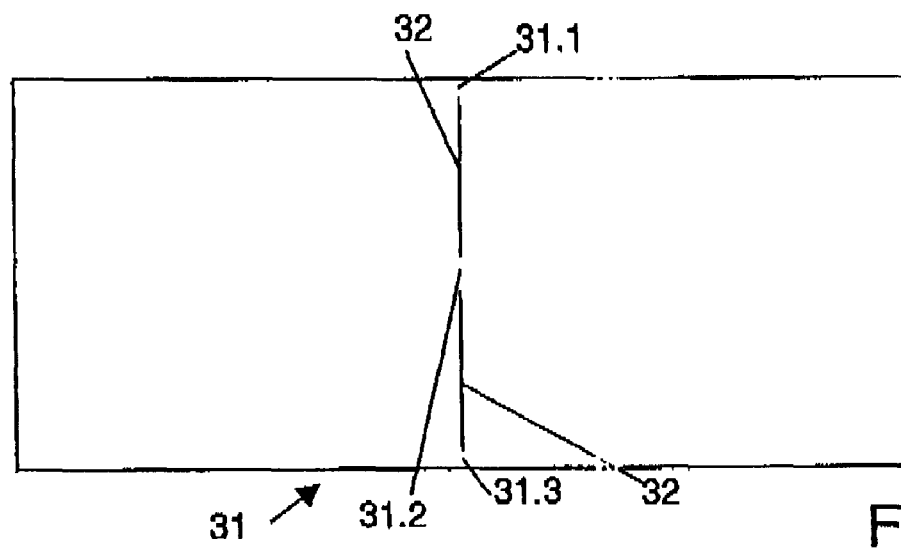
FIG. 4 shows a schematic view of an electrical connecting element with a predetermined breaking point.

In FIG. 4, the question of the lateral positioning of the cut (and thus of the predetermined breaking point) is addressed. Whereas in some embodiments the cut 32 goes in a straight line across the electrical connecting element 31 or a proportion thereof, it may also be interrupted to form bridges 31.1, 31.2, 31.3 so that during the manufacturing process, after the cutting, the parts 31.4, 31.5 are not completely separated. This is advantageous in situations where one can not or does not want to use an alignment tool to position the parts 31.4, 31.5 while adding the additional layers. In an environment of the bridges, 31.1, 31.2, 31.3, the breaking location is not so well-defined, so that a broader 'security zone' (area where no conductor paths ought to be) has to be taken care of. However, the important advantage of the invention making possible an increased wiring density nevertheless persists, since the bridges are well confined along the predetermined breaking point.

Figure 5A:
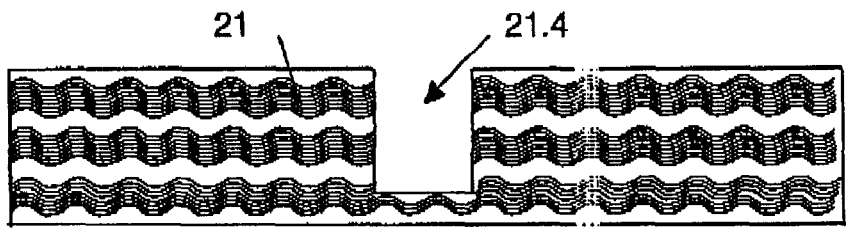
FIGS. 5a through 5e illustrate, in a sequence, the product when undergoing a process according to a variant of the process illustrated in FIGS. 3a through 3e.
Figure 5B:
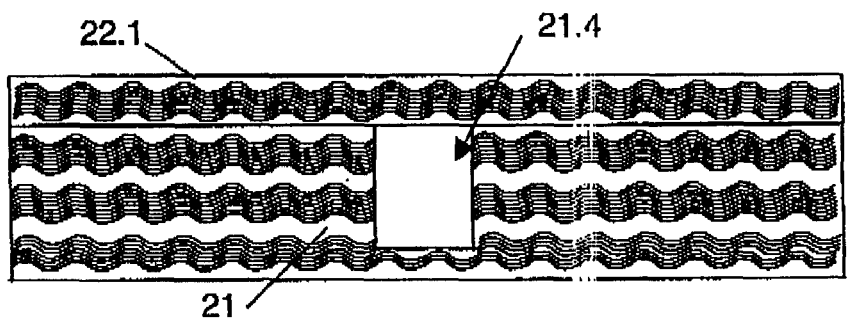
Figure 5C:
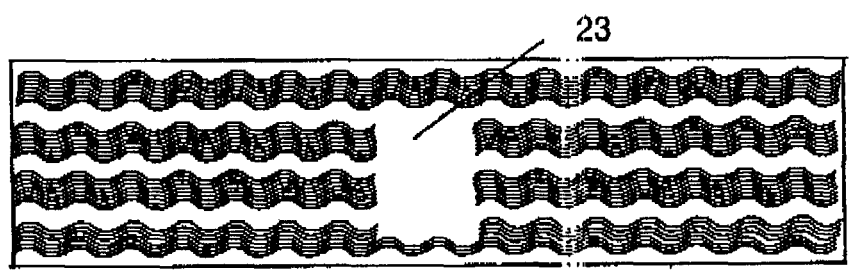
Figure 5D:
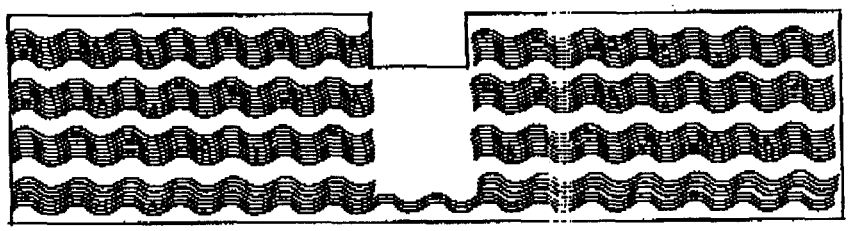
Figure 5E:
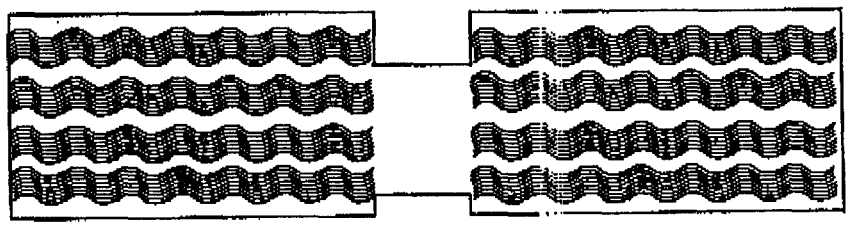

A variant of the method, where an impregnated fiber layer or impregnated fiber layers is/are only added to one face 21.2 of the core is shown in FIGS. 5a through 5e. FIG. 5a shows the core with a cut 21.4, which in the drawings does not reach through the core 21. FIG. 5b depicts the core with a single layer 22.1 of fiber material impregnated by resin. After laminating the core and the layer 22.1 onto each other, the cut 21.4 is at least partially filled with resin material (FIG. 5c). The step of grooving the resulting product so that the fiber material is cut is performed at least on the face where the layer 22.1 of fiber material impregnated by resin is added. FIG. 5d depicts the situation where only the first face is grooved, whereas FIG. 5e shows the situation with grooves on both faces. The variant of FIG. 5e features the advantage that, like in the embodiment shown in FIG. 3e, when the electrical connecting element is broken along the predetermined breaking point, no fiber material may come off. Under certain circumstances, especially under clean conditions, this may be an important prerequisite.

The variant with an impregnated fiber layer or impregnated fiber layers added to only one face of the core also works with a cut as shown in FIG. 3b which reaches through the core.

Various other embodiments may be envisaged without departing from the scope and spirit of the invention.

What is claimed is:

1. A method of manufacturing an electrical connecting element with a predetermined breaking point, comprising the steps of:
   providing a core which comprises fiber reinforced material;
   cutting the core at a cutting location where the predetermined breaking point is to be, and thereby creating a cut in the core;
   adding at least one layer comprising a dielectric material in a non-hardened state, said layer at least partially covering the cut, thereby at least partially filling the cut with said dielectric material;
   hardening the dielectric material; and
   grooving or cutting the layer at the cutting location.

2. The method according to claim 1, wherein said layer further comprises a fiber material and wherein said step of cutting the layer at the cutting location includes cutting through the fiber material at the cutting location.

3. The method according to claim 2, wherein fibers of the fiber material have an average length exceeding 1 mm.

4. The method according to claim 1, wherein the core is plate shaped with two faces, and wherein the step of adding at least one layer comprising a dielectric material in a non-hardened state to the core includes adding at least one layer to each face.

5. The method according to claim 4, wherein the at least one layer added to each face each further comprise a fiber material, and wherein the fiber material of the layer or layers added to each face is cut at the cutting location.

6. The method according to claim 1, wherein the core is cut by laser cutting.

7. The method according to claim 6, wherein the layer is cut by laser cutting.

8. The method according to claim 1, wherein fibers of the fiber reinforced material have an average length exceeding 1 mm.

* * * * *